(12) United States Patent
Fukuda et al.

(10) Patent No.: US 10,007,040 B2
(45) Date of Patent: Jun. 26, 2018

(54) DISPLAY UNIT AND ELECTRONIC APPARATUS

(71) Applicants: JOLED INC., Tokyo (JP); Japan Display Inc., Tokyo (JP)

(72) Inventors: Toshihiro Fukuda, Tokyo (JP); Kaoru Abe, Tokyo (JP); Hideki Kobayashi, Tokyo (JP)

(73) Assignees: Joled Inc., Tokyo (JP); Japan Display Inc., Tokyo (JP)

( * ) Notice: Subject to any disclaimer, the term of this patent is extended or adjusted under 35 U.S.C. 154(b) by 23 days.

(21) Appl. No.: 15/266,300

(22) Filed: Sep. 15, 2016

(65) Prior Publication Data

US 2017/0097452 A1 Apr. 6, 2017

(30) Foreign Application Priority Data

Oct. 5, 2015 (JP) .................. 2015-197548

(51) Int. Cl.
| | |
|---|---|
| *G02B 5/20* | (2006.01) |
| *G02B 5/28* | (2006.01) |
| *F21V 9/08* | (2018.01) |
| *F21V 9/14* | (2006.01) |
| *F21V 33/00* | (2006.01) |
| *G02B 5/30* | (2006.01) |

(Continued)

(52) U.S. Cl.
CPC ............... *G02B 5/285* (2013.01); *F21V 9/08* (2013.01); *F21V 9/14* (2013.01); *F21V 33/0052* (2013.01); *G02B 5/20* (2013.01); *G02B 5/205* (2013.01); *G02B 5/3033* (2013.01); *H01L 51/5262* (2013.01); *H01L 51/5265* (2013.01); *F21Y 2115/20* (2016.08)

(58) Field of Classification Search
CPC .......... G02B 5/285; G02B 5/02; G02B 5/205; G02B 5/3033; G02B 5/3041; G02B 5/305; F21V 9/08; F21V 9/00; F21V 9/14; F21V 33/0052; H01L 51/5262; H01L 51/5265
USPC ..................................... 359/491.01
See application file for complete search history.

(56) References Cited

U.S. PATENT DOCUMENTS

| | | | |
|---|---|---|---|
| 6,344,712 B1* | 2/2002 | Eida ...................... | H01L 27/322 313/461 |
| 2003/0007033 A1* | 1/2003 | Ito ........................... | B41J 2/15 347/40 |

(Continued)

FOREIGN PATENT DOCUMENTS

JP 2015-026560 A 2/2015

*Primary Examiner* — William R Alexander
(74) *Attorney, Agent, or Firm* — K&L Gates LLP

(57) ABSTRACT

A display unit includes a plurality of light-emitting sections and an optical filter. The plurality of light-emitting sections emit color light beams having different colors. The optical filter is disposed on light emission side of the plurality of light-emitting sections, and transmits the color light beams while selectively removing a part of a wavelength band of the color light beams. The optical filter includes the first filter layer and the second filter layer. The first filter layer transmits a first band including a center wavelength out of the wavelength band of each of the color light beams, and removes a second band that is at least a part of a band other than the first band. The second filter layer reduces transmissivity of a third band that is a part of the first band of at least one color light beam out of the color light beams.

16 Claims, 9 Drawing Sheets

(51) Int. Cl.
*H01L 51/52* (2006.01)
*F21Y 115/20* (2016.01)

(56) References Cited

U.S. PATENT DOCUMENTS

| | | | |
|---|---|---|---|
| 2005/0280008 A1* | 12/2005 | Ricks | C09K 11/06 257/79 |
| 2007/0188084 A1* | 8/2007 | Fukuoka | H01L 51/5265 313/506 |
| 2008/0158488 A1* | 7/2008 | Yanai | G02F 1/133371 349/107 |
| 2009/0195152 A1* | 8/2009 | Sawano | B82Y 20/00 313/504 |
| 2010/0123384 A1* | 5/2010 | Miller | H01L 27/3293 313/498 |
| 2012/0112172 A1* | 5/2012 | Kashiwabara | H01L 27/3211 257/40 |
| 2012/0206675 A1* | 8/2012 | Seo | H01L 27/3211 349/96 |
| 2013/0016296 A1* | 1/2013 | Fujita | H01L 27/322 349/42 |
| 2014/0035456 A1* | 2/2014 | Isa | H01L 51/5265 313/498 |
| 2014/0043546 A1* | 2/2014 | Yamazaki | G02F 1/13338 349/12 |
| 2014/0284590 A1* | 9/2014 | Nakazawa | G02B 5/201 257/40 |
| 2015/0029724 A1 | 1/2015 | Shiratori et al. | |
| 2015/0168621 A1* | 6/2015 | Huang | G02B 5/288 359/585 |
| 2015/0212540 A1* | 7/2015 | Tsujimoto | G02F 1/13338 345/174 |
| 2017/0033317 A1* | 2/2017 | Kajimoto | H01L 51/5044 |

\* cited by examiner

DISPLAY UNIT AND ELECTRONIC APPARATUS

CROSS-REFERENCE TO RELATED APPLICATIONS

The present application claims priority from Japanese Patent Application No. 2015-197548 filed on Oct. 5, 2015, the entire contents of which are hereby incorporated by reference.

BACKGROUND

The disclosure relates to a display unit and an electronic apparatus that allow for color display using three primary colors.

In general, display units that perform image display using three primary colors of Red, Green, and Blue (RGB) employ a system of mounting a color filter (CF) in order to expand a color reproduction range.

The color filter is configured by four types of materials, i.e., filter materials of respective colors R, G and B, and a black matrix material, for example; a pigment or a dye is used as the filter materials of the respective colors. In order to secure a sufficient color reproduction range in such a color filter, it is preferable to increase the concentration of the pigment or the dye. However, increased concentration causes the transmissivity to be lowered, although the color reproduction range is expanded. Further, when light leaks into an adjacent pixel, the light leakage is recognized as color mixing and lowers the color reproduction range, thus affecting image quality. Accordingly, proper alignment is demanded. Alternatively, there is a demand for a design in which the light leaking to an adjacent pixel satisfies a critical condition; such design includes decreased distance between a light-emitting section of a pixel and a color filter.

However, larger-sized substrates and finer pixels make it difficult to maintain sufficient alignment accuracy. Accordingly, it is necessary to keep a margin at the time of alignment, causing an opening of a light-emitting section to be narrowed. This leads to increased current density as well as deteriorated luminance in a self-emitting device, for example.

Under such circumstances, there is proposed a display unit using an interference notch filter, as disclosed in Japanese Unexamined Patent Application Publication (JP-A) No. 2015-26560, for example. This display unit combines with a color filter and the notch filter to enable more enhanced color purity than a display unit only using a color filter.

SUMMARY

Although the technique of JP-A No. 2015-26560 enables expansion of the color reproduction range by enhancing the color purity, chromaticity easily changes depending on the change in a viewing angle, thus leaving a room for improvement in viewing angle characteristics.

It is desirable to provide a display unit and an electronic apparatus that enable improvement of viewing angle characteristic while securing a color reproduction range.

A display unit according to an embodiment of the disclosure includes a plurality of light-emitting sections and an optical filter. The plurality of light-emitting sections emit the respective color light beams having colors different from one another. The optical filter is disposed on light emission side of the plurality of light-emitting sections and transmits the color light beams while selectively removing a part of a wavelength band of the color light beams. The optical filter includes a first filter layer and a second filter layer. The first filter layer transmits a first band including a center wavelength out of the wavelength band of each of the color light beams, and removes a second band that is at least a part of a band other than the first band. The second filter layer reduces transmissivity of a third band that is a part of the first band of at least one color light beam out of the color light beams.

An electronic apparatus according to an embodiment of the disclosure includes a display unit according to an embodiment of the disclosure. The display unit includes a plurality of light-emitting sections and an optical filter. The plurality of light-emitting sections emit the respective color light beams having colors different from one another. The optical filter is disposed on light emission side of the plurality of light-emitting sections and transmits the color light beams while selectively removing a part of a wavelength band of the color light beams. The optical filter includes a first filter layer and a second filter layer. The first filter layer transmits a first band including a center wavelength out of the wavelength band of each of the color light beams, and removes a second band that is at least a part of a band other than the first band. The second filter layer reduces transmissivity of a third band that is a part of the first band of at least one color light beam out of the color light beams.

BRIEF DESCRIPTION OF THE DRAWINGS

The accompanying drawings are included to provide a further understanding of the disclosure, and are incorporated in and constitute a part of this specification. The drawings illustrate example embodiments and, together with the specification, serve to explain the principles of the technology.

DETAILED DESCRIPTION

Some example embodiments of the disclosure are described below in detail, in the following order, with reference to the accompanying drawings.

1. Example Embodiment (An example of a display unit provided with an optical filter including an unnecessary-light-removing filter layer and a viewing-angle-correcting filter layer)

2. Application Example (An example of an electronic apparatus)

Example Embodiment

[Configuration]

Figure 1:
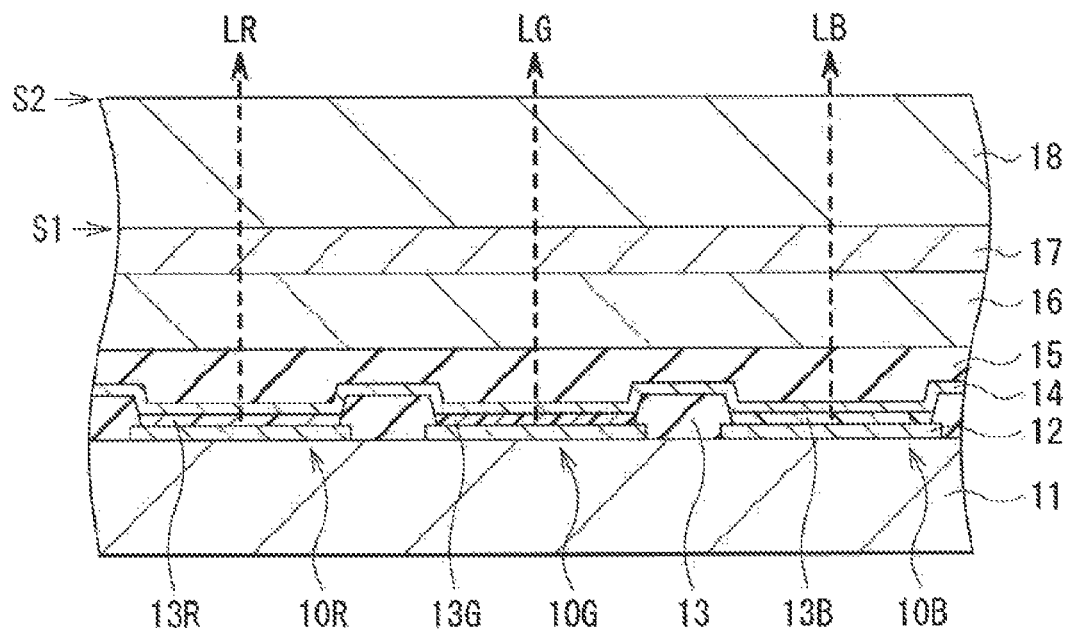
FIG. 1 is a cross-sectional view of a configuration of a display unit according to an example embodiment of the disclosure.

FIG. 1 illustrates a cross-sectional configuration of a display unit 1 according to an example embodiment of the disclosure. The display unit 1 includes a plurality of organic electroluminescence (EL) devices 10R, 10G, and 10B on a drive substrate 11. The organic EL device 10R includes on a first electrode 12 a red-light-emitting layer 13R and a second electrode 14 in this order. The organic EL device 10G includes on a first electrode 12 a green-light-emitting layer 13G and the second electrode 14 in this order. The organic EL device 10B includes on a first electrode 12 a blue-light-emitting layer 13B and the second electrode 14 in this order. The organic EL devices 10R, 10G, and 10B each may be a top emission light-emitting device, for example. However, the organic EL devices 10R, 10G, and 10B each also may be a bottom emission light-emitting device.

The organic EL devices 10R, 10G, and 10B emit color light beams having colors different from each other, for example, color light beams of three primary colors, R (red), G (green), and B (blue) (light beams: LR, LG, and LB), respectively. The display unit 1 may display a color image by means of additive color mixture using, as one pixel unit, a set of three pixels (subpixels) of R, G, and B including the respective organic EL devices 10R, 10G, and 10B. It is to be noted that the organic EL devices 10R, 10G, and 10B in the present example embodiment correspond to a specific but non-limiting example of the "light-emitting section" according to an embodiment of the disclosure. Hereinafter, the configuration of each component is described.

The drive substrate 11 may include a substrate made of a material such as glass or plastic, and an electronic circuit provided thereon for driving the organic EL devices 10R, 10G, and 10B.

The first electrode 12 may be provided for each of the organic EL devices 10R, 10G, and 10B (provided for each pixel), for example, and may function as an electrode that injects a hole into each of the red-light-emitting layer 13R, the green-light-emitting layer 13G, and the blue-light-emitting layer 13B, for example. The first electrode 12 may be made of an electrically conductive material having optical reflectivity, for example, a single metal element such as silver (Ag) and aluminum (Al), or an alloy thereof. The first electrode 12 may be electrically coupled to a pixel circuit provided in the electronic circuit of the drive substrate 11. An insulating film 13 may be provided in a region between pixels on the first electrode 12. This insulating film 13 may cause the first electrodes 12 provided for each pixel to be electrically separated from each other.

The red-light-emitting layer 13R, the green-light-emitting layer 13G, and the blue-light-emitting layer 13B may each contain an organic compound that emits light as a result of the generation of an exciton due to recombination of an electron and a hole injected through the first electrode 12 and the second electrode 14. Although not illustrated herein, there may be provided, for example, a hole transport layer (HTL) and a hole injection layer (HIL) between each of the red-light-emitting layer 13R, the green-light-emitting layer 13G and the blue-light-emitting layer 13B, and the first electrode 12. Further, there may be provided layers such as an electron transport layer (ETL) and an electron injection layer (HIL) between each of the red-light-emitting layer 13R, the green-light-emitting layer 13G and the blue-light-emitting layer 13B, and the second electrode 14.

The second electrode 14 may be provided as a layer common to each pixel, for example, and may function as an electrode that injects an electron to each of the red-light-emitting layer 13R, the green-light-emitting layer 13G and the blue-light-emitting layer 13B. Examples of a material for forming the second electrode 14 may include an electrically conductive material having optical transparency, for example, a transparent electrically conductive film made of an oxide such as an indium-tin oxide (ITO), an indium-zinc oxide (IZO), or an indium-gallium-zinc oxide (IGZO).

A counter substrate 18 may be disposed on the second electrode 14 with a protective film 15 and a sealing layer 16 interposed therebetween.

The protective film 15 may include an inorganic material such as silicon nitride and silicon oxide, for example. The sealing layer 16 may be made of a thermosetting sealing resin or an ultraviolet ray-curable resin, for example. The counter substrate 18 may be made of a substrate material having optical transparency such as glass or plastic.

In the present example embodiment, an optical filter 17 is provided on light emission side of the organic EL devices 10R, 10G, and 10B in the foregoing display unit 1. While the optical filter 17 according to this example embodiment is provided between the counter substrate 18 and the sealing layer 16, a position at which the optical filter 17 is disposed is not limited thereto. The optical filter 17 may be provided at any position as long as the optical filter 17 is disposed on the light emission side of the organic EL devices 10R, 10G, and 10B. For example, the optical filter 17 either may be provided between the protective film 15 and the sealing layer 16, or may be provided on the counter substrate 18. The optical filter 17 includes a plurality of refractive index layers as described later; the plurality of refractive index layers either may be provided at one location (collectively), or may be provided at two locations or more (separately).

The optical filter 17 has optical characteristics of transmitting incident light while selectively removing a part of a band of its wavelength band. The optical filter 17 may be disposed continuously throughout all the pixels as a layer common to each of the pixels (organic EL devices 10R, 10G, and 10B).

Figure 2:
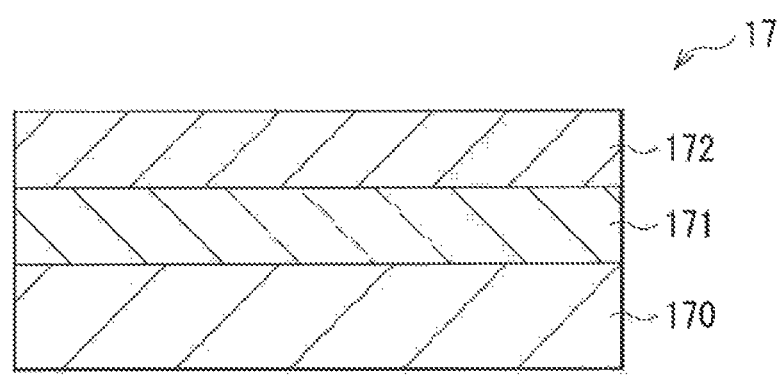
FIG. 2 is a schematic cross-sectional view of a configuration example of an interference filter illustrated in FIG. 1.
Figure 3:
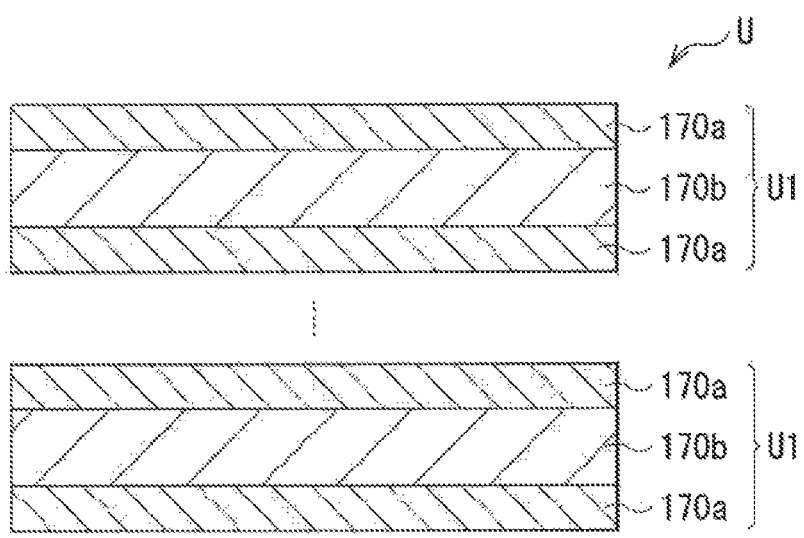
FIG. 3 is a schematic cross-sectional view of a detailed configuration example of each of filter layers illustrated in FIG. 2.

FIG. 2 illustrates a specific configuration example of the optical filter 17. FIG. 3 illustrates a detailed configuration example of each of filter layers that form the optical filter 17.

As illustrated in FIG. 2, the optical filter 17 may have a configuration in which an unnecessary-light-removing filter layer 171 (first filter layer) and a viewing-angle-correcting filter layer 172 (second filter) are layered on a substrate 170, for example. However, the order of layering the unnecessary-light-removing filter layer 171 and the viewing-angle-correcting filter layer 172 is not particularly limited. While the unnecessary-light-removing filter layer 171 and the viewing-angle-correcting filter layer 172 may each include one or a plurality of dielectric multilayer film units U as described later, a dielectric multilayer film unit U for removing unnecessary light and a dielectric multilayer film unit U for correcting a viewing angle may be layered in a mixed manner. Alternatively, the unnecessary-light-removing filter layer 171 and the viewing-angle-correcting filter layer 172 may be provided with the substrate 170 interposed (so as to sandwich the substrate 170) therebetween. The substrate 170 either may be the counter substrate 18, or may be a substrate provided separately from the counter substrate 18.

[Configuration of Optical Filter 17]

The unnecessary-light-removing filter layer 171 and the viewing-angle-correcting filter layer 172 may each include one or a plurality of dielectric multilayer film units U (dielectric multilayer film), and may exhibit optical characteristics to be described later utilizing an optical interference effect. More specifically, the dielectric multilayer film unit U may have a configuration in which a plurality of refractive index layers having different refractive indices are adjacently layered. As an example, a plurality of low refractive index layers 170a made of a low refractive index material and a plurality of high refractive index layers 170b made of a high refractive index material are each layered, as illustrated in FIG. 3. More particularly, for example, a layer unit U1 is set as a structure in which the high refractive index layer 170b is sandwiched by the low refractive index layers 170a; the dielectric multilayer film unit U may have a configuration in which a plurality of the layer units U1 are layered.

An optical path length (optical length) $d_1$ of the low refractive index layer 170a in the layer unit U1 may be represented, for example, by the following expression (1), where L denotes the optical path length of the low refractive index layer 170a corresponding to ¼ of a central wavelength $\lambda_0$ ($\lambda_0/4$) of interference light. On the other hand, an optical path length $d_2$ of the high refractive index layer 170b may be represented, for example, by the following expression (2), where H denotes the optical path length of the high refractive index layer 170b corresponding to ¼ of the central wavelength $\lambda_0$. In the unnecessary-light-removing filter layer 171 and the viewing-angle-correcting filter layer 172, the layer units U1 that satisfy such conditional expressions are layered in the number of layers (the number of repetition) k, with the proviso that n, m, and k are each any integer. It is to be noted that the optical path length $d_1$ may be an optical path length of the high refractive index layer 170b, and that the optical path length $d_2$ may be an optical path length of the low refractive index layer 170a.

$$d_1=[(4n+1)/2] \cdot L \quad (1)$$

$$d_2=(2m+1) \cdot H \quad (2)$$

As an example, where n=m=1, it is possible to design the dielectric multilayer film unit U having the layer unit U1 for each band (bands b2 and b3 to be described later) to be removed selectively by the optical filter 17. In this case, in the unnecessary-light-removing filter layer 171, the dielectric multilayer film units U may be layered, which have the same number as that of the bands b2 set in the spectral transmissivity of the unnecessary-light-removing filter layer 171. Likewise, in the viewing-angle-correcting filter layer 172, the dielectric multilayer film units U may be layered, which have the number corresponding to the number of the bands b3 set in the spectral transmissivity of the viewing-angle-correcting filter layer 172. However, depending on the combination of n and m, it is possible to design spectral transmissivity including a plurality of the bands b2, or to design spectral transmissivity including both the band b2 and the band b3 in one dielectric multilayer film unit U.

The optical filter 17 may be provided with a ripple-regulating filter layer, for example, in addition to the above-described unnecessary-light-removing filter layer 171 and viewing-angle-correcting filter layer 172. The ripple-regulating filter layer may have a film thickness of "$\lambda_0/8$" or "$(2j+1)/2\lambda_0$," for example. The ripple-regulating filter layer either may be made of the same material as those of the low refractive index layer 170a and the high refractive index layer 170b, or may be made of a different material.

The foregoing layered structure enables, in each dielectric multilayer film unit U, the obtainment of spectral transmissivity having a sharp (steep) rising from the bands b2 with the central wavelength $\lambda_0$ as a bottom peak and b3 toward a transmission band, and having high transmissivity (reaching about 100%) in the transmission band.

Figure 4:
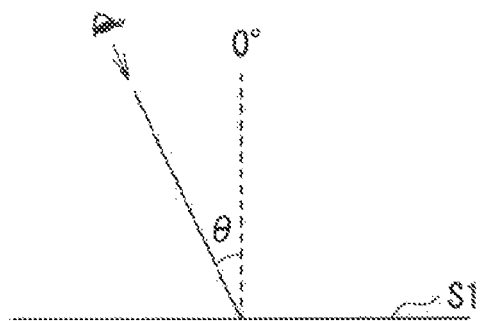
FIG. 4 is an explanatory schematic diagram of a viewing angle.

In such a dielectric multilayer film unit U, a plurality of refractive index layers (low refractive index layer 170a and high refractive index layer 170b) to be layered may preferably have a volume average refractive index of 2.0 or higher. The central wavelength $\lambda_0$ of interference light shifts by $\Delta\lambda$ represented by expression (3) at a position of viewing angle θ. As illustrated in FIG. 4, the viewing angle θ corresponds to an angle inclined (oblique direction) from a direction orthogonal to a light emission surface S1 (front direction), which direction is set as 0°. Further, θ' in the expression (3) is represented by expression (4). $n_{ave}$ is a volume average refractive index of the refractive index layers forming the dielectric multilayer film unit U, and is represented by expression (5), with the proviso that $n_1$ denotes a refractive index of the low refractive index layer 170a, and that $n_2$ denotes a refractive index of the high refractive index layer 170b.

$$\Delta\lambda=(\cos\theta'-1)\lambda_0 \quad (3)$$

$$\theta'=\sin^{-1}(\sin\theta/n_{ave}) \quad (4)$$

$$n_{ave}=(n_1 \cdot d_1+n_2 \cdot d_2)/(d_1+d_2) \quad (5)$$

Figure 5:
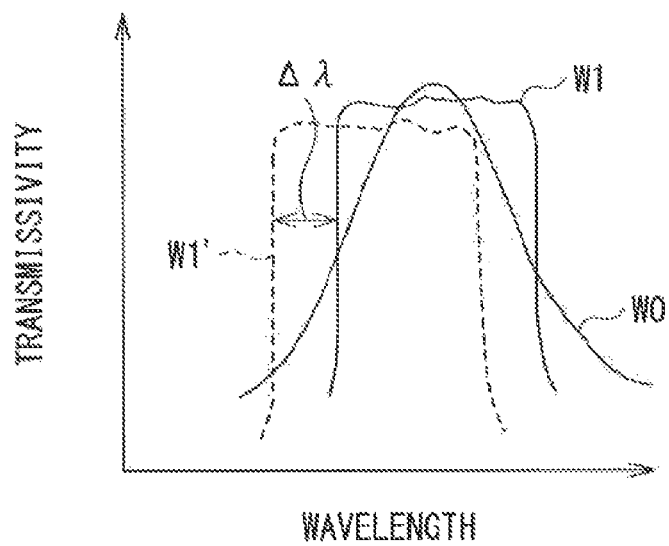
FIG. 5 is an explanatory schematic diagram of a preferred range of volume average refractive index.

As illustrated schematically in FIG. 5, in the spectral transmissivity of the optical filter 17, a waveform W1' at the viewing angle θ (>0°) shifts by $\Delta\lambda$ from a waveform W1 at a viewing angle of 0°. This is because the central wavelength of the interference light shifts toward a short wavelength side. For example, in B light beam, as the viewing angle θ increases, the waveform W1 shifts toward the short wavelength side, along with monotonous decrease of the transmissivity itself. When the shift amount $\Delta\lambda$ becomes too large, so that the waveform W1 undesirably shifts so as to deviate largely from the central wavelength (peak of waveform W0) of incident light (emission light of an organic EL device), it becomes difficult to easily obtain effects (improvement of viewing angle characteristics) by the viewing-angle-correcting filter layer 172 to be described later. In order to suppress the shift amount $\Delta\lambda$ within an allowable range and to allow the effects by the viewing-range-correcting filter layer 172 to be effective, it is preferable that the refractive index layers have a volume average refractive index of 2.0 or higher. In addition, in order to maintain sufficient image quality, it is preferable that the change in chromaticity (Δu'v') at a viewing angle of 45° be 0.040 or lower; it is possible to achieve this value by setting the volume average refractive index to 2.0 or higher.

Examples of a material for forming each refractive index layer of the dielectric multilayer film unit U may include a material that allows for film formation of a dielectric, for example, a material that allows for the film formation by means of vapor deposition method, chemical vapor deposition (CVD) method, sputtering method, and other methods. Examples thereof may include silicon nitride ($SiN_X$), silicon oxide ($SiO_X$), and a metal oxide film having optical transparency. For example, silicon nitride enables adjustment of various refractive indices from a low refractive index to a high refractive index depending on film-forming conditions, or other factors. Further, a metal oxide film allows for easy adjustment of a film having a refractive index of 2.0 or higher.

When light other than display light, such as outside light enters the optical filter 17, light of a part of a band of the incident light is undesirably reflected, sometimes causing visibility to be lowered. Accordingly, it is preferable to use a circularly polarizing plate. It is preferable, for example, to provide a circularly polarizing plate at a position above the optical filter 17 of the display unit 1, for example, at a position between the optical filter 17 and the counter substrate 18 (at position S1 in FIG. 1), or at a position on the counter substrate 18 (at position S2 in FIG. 1). However, the circularly polarizing plate may not be disposed as long as the display unit 1 is used for a use application where no outside light enters.

(Optical Characteristics of Optical Filter 17)

Figure 6:
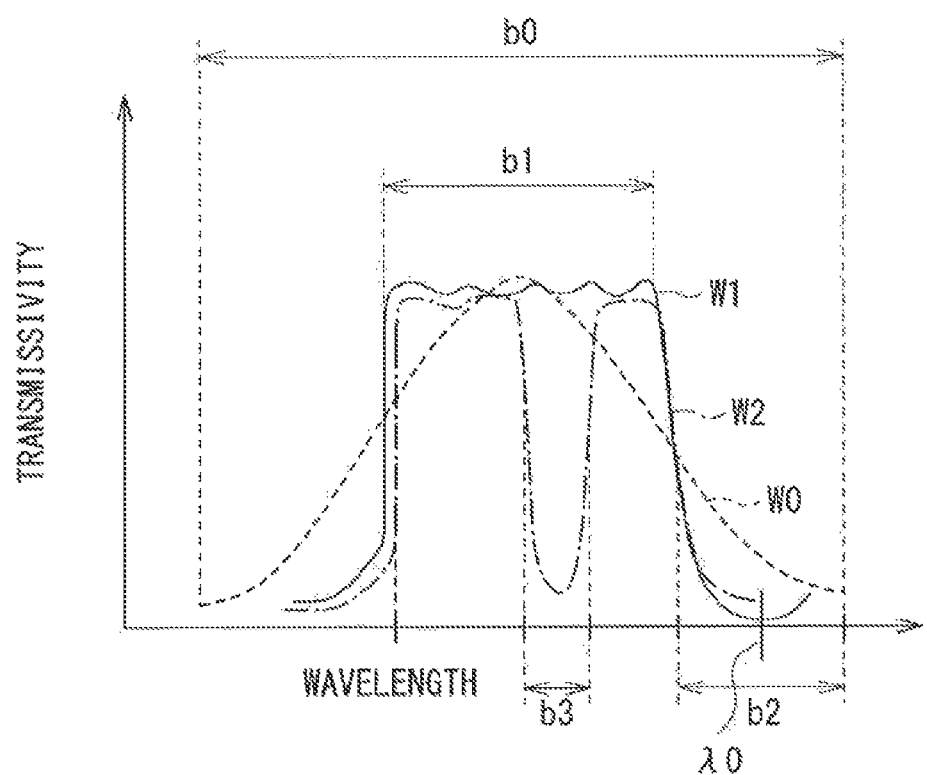
FIG. 6 is an explanatory characteristic diagram of optical characteristics of the optical filter illustrated in FIGS. 1 and 2.

FIG. 6 is an explanatory characteristic diagram of optical characteristics of the optical filter 17. The unnecessary-light-removing filter layer 171 transmits a band (band b1) including each central wavelength of color light (LR, LG, and LB) emitted respectively from the organic EL devices 10R, 10G, and 10B, and selectively removes a band (band b2) that is at least a part of a band other than the band b1, due to the aforementioned layered structure of the dielectric multilayer film unit U. In some cases, the unnecessary-light-removing filter layer 171 may reduce the transmissivity of the band b2. For example, the unnecessary-light-removing filter layer 171 may block, utilizing an interference effect, a part of a band other than the central wavelengths of a wavelength band corresponding to R (620 nm or higher), of a wavelength band corresponding to G (about 495 nm to 570 nm both inclusive), and of a wavelength band corresponding to B (495 nm or lower) out of visible bands.

As illustrated in FIG. 6, the spectral transmissivity of the unnecessary-light-removing filter layer 171 has the waveform W1 (solid line) including the band b1 and the band b2 as described above. The band b1 has a width narrower than that of a wavelength band b0 of the optical spectrum of a color light beam LR (LG or LB) emitted from the organic EL device 10R (organic EL device 10G or 10B) (b1<b0). The band b2 corresponds to a part of the wavelength band b0 (e.g., lower slope part of the waveform W0). As described above, the rising of the transmissivity of the waveform W1 between the bands b1 and b2 is sharp. Thus, in the spectral transmissivity of the unnecessary-light-removing filter layer 171, the bands b1 and b2 may be set, for example, to remove the lower slope part (unnecessary light) of the wavelength band b0 of the color light beams of different colors R, G, and B, and to narrow each wavelength band b0.

The band b2 may be set at one location (either lower slope part at the right or the left of a central wavelength), or at two locations (lower slope parts both at the right and the left) for each of the wavelength bands b0 of R, G, and B. Accordingly, in the spectral transmissivity of the unnecessary-light-removing filter layer 171, the band b2 may be set at one to six location(s), for example. It is sufficient that the band b2 may be set at a proper location depending on factors such as spectral shapes of color light beams LR, LG, and LB. It is to be noted that a wavelength that is the bottom peak of the band b2 of the waveform W1 corresponds to the foregoing central wavelength $\lambda_0$ of the interference light in the dielectric multilayer film.

The viewing-angle-correcting filter layer 172 reduces the transmissivity of a band (band b3) that is a part of a band (band b1) of at least one color light beam of a plurality of color light beams (in the present example embodiment, color light beams of three colors R, G, and B), which is transmitted through the unnecessary-light-removing filter layer 171 as described above.

That is, as illustrated in FIG. 6, the spectral transmissivity of the viewing-angle-correcting filter layer 172 has a waveform W2 (alternate long and short dash line) in which the transmissivity of the band b3 is reduced, that is a part of the band b1 which is transmitted through the unnecessary-light-removing filter layer 171.

The band b3 may be able to be set at one location or two or more locations in the spectral transmissivity of the optical filter 17. In the emission light of the unnecessary-light-removing filter layer 171, as the viewing angle is increased, at least one component of tristimulus values X, Y, and Z fluctuates (increases or decreases) in accordance with increased viewing angle. This fluctuation of a specific component causes the chromaticity to be changed. The band b3 may be set to cause the viewing-angle-correcting filter layer 172 to offset (negate or complement) the fluctuation of a component in association with such change in the viewing angle. It is to be noted that, in any case of complementing a component of the tristimulus values X, Y, and Z, a band of low transmissivity, i.e., the band b3 may be provided in the spectral transmissivity of the viewing-angle-correcting filter layer 172. Further, the transmissivity and the position of the band b3 may be set depending on which component is complemented. The transmissivity and the position of the band b3 may be able to be controlled by adjusting refractive index difference and the number of layers in the dielectric multilayer film unit U.

Figure 7:
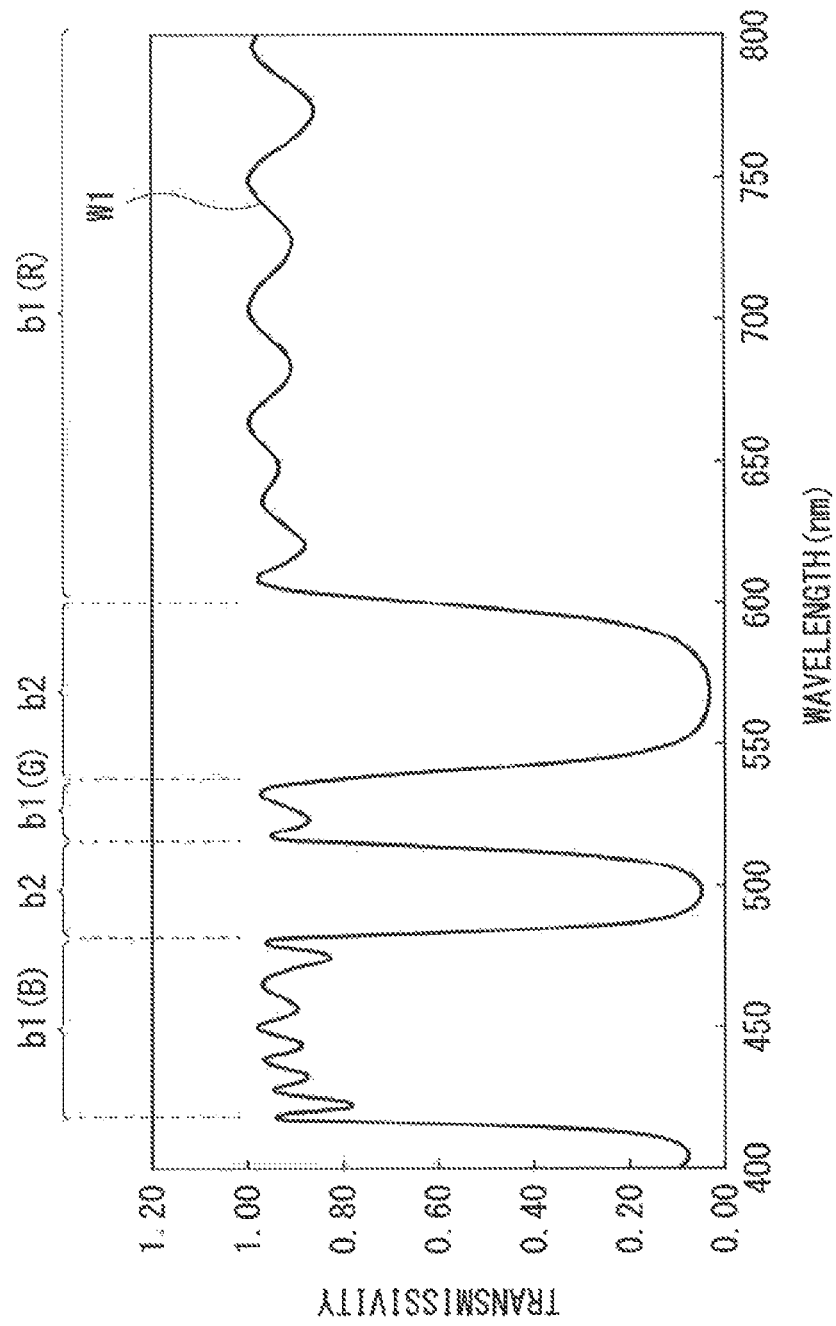
FIG. 7 is a characteristic diagram illustrating spectral transmissivity of an unnecessary-light-removing filter layer illustrated in FIG. 2.
Figure 8:
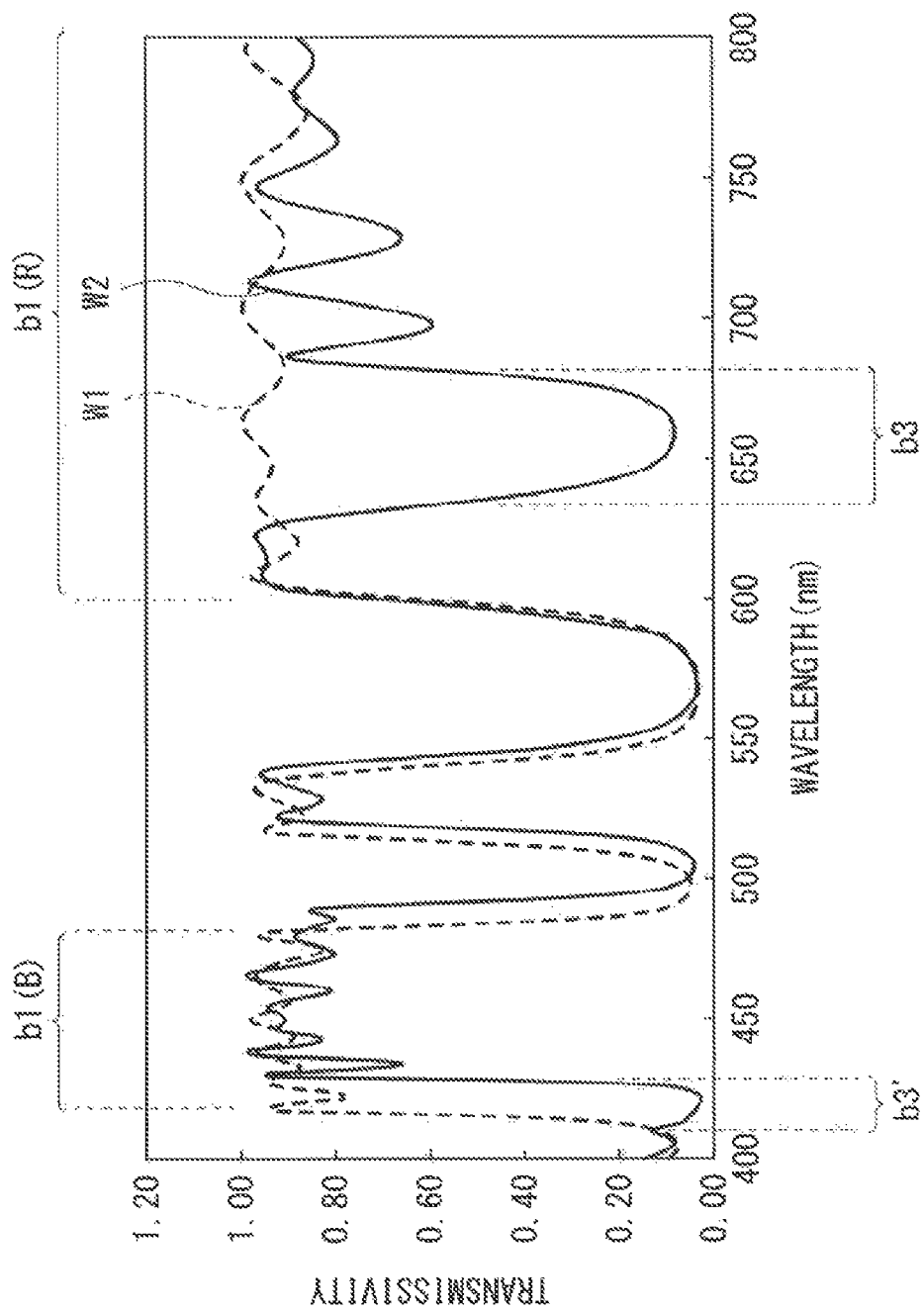
FIG. 8 is a characteristic diagram illustrating spectral transmissivity at the time when a viewing-angle-correcting filter layer illustrated in FIG. 2 is combined, together with the spectral transmissivity of the unnecessary-light-removing filter layer illustrated in FIG. 7.

An example of the optical filter 17 having the foregoing optical characteristics is illustrated in FIGS. 7 and 8. FIG. 7 illustrates spectral transmissivity (waveform W1) in the unnecessary-light-removing filter layer 171, and FIG. 8 illustrates spectral transmissivity (waveform W2) after combining the viewing-angle-correcting filter layer 172 with the unnecessary-light-removing filter layer 171 illustrated in FIG. 7. It is to be noted that FIG. 8 also illustrates the spectral transmissivity (waveform W1) of the unnecessary-light-removing filter layer 171 illustrated in FIG. 7.

As illustrated in FIG. 7, the bands b1 and b2 are set to cause the unnecessary-light-removing filter layer 171 to narrow a wavelength of each color light beam of the colors R, G, and B. In this example, the band b2 is set at two locations. Further, the bands b1 (b1(R), b1(G), and b1(B)) each of which is a transmission band of the waveform W1 each have a transmissivity closer to 100% (1.00). In addition, the rising from the band b2 to the band b1 is sharp. It is to be noted that, in this example, the unnecessary-light-removing filter layer 171 may include one or a plurality of dielectric multilayer film units U, in order to set the band b2 (in order to selectively remove the band b2) at two locations.

The spectral transmissivity when combining the viewing-angle-correcting filter layer 172 with the unnecessary-light-removing filter layer 171 having the above-described spectral transmissivity (i.e., the spectral transmissivity of the optical filter 17) may be set as illustrated in FIG. 8, for example. It is to be noted that, in FIG. 8, the waveform W1 of the spectral transmissivity of the unnecessary-light-removing filter layer 171 (alone) illustrated in FIG. 7 is indicated by a broken line. Thus, the viewing-angle-correcting filter layer 172 may be configured to reduce the transmissivity of a part of the band b3 of the band b1 which is transmitted through the unnecessary-light-removing filter layer 171. In this example, the band b3 is set at one location. More specifically, the band b3 may be designed to be a band that is a part of the band b1(R) corresponding to the light beam of R. More particularly, the band b3 may be designed to be a band near 660 nm, of a band including a large number of the X component of the tristimulus values X, Y, and Z. In this example, a band that includes the X component the most is a band near 600 nm. In this example, the viewing-angle-correcting filter layer 172 may include one dielectric multilayer film unit U, for example, in order to set one band b3. Further, combination of the viewing-angle-correcting filter layer 172 may also selectively remove a band b3' near 420 nm including a large number of the Z component, for example, in the waveform W2. The foregoing factors such as the number and the positions of the bands b2 and b3 are mere examples, and are not limitative.

[Function and Effects]

When a drive current is injected into each emission layer of the organic EL devices 10R, 10G, and 10B (red-light-emitting layer 13R, green-light-emitting layer 13G, and blue-light-emitting layer 13B) via the first electrode 12 and the second electrode 14, a hole and an electron are recombined in each emission layer to generate an exciton, leading to light emission. This causes the red light beam LR to be emitted upward from the organic EL device 10R, the green light beam LG to be emitted upward from the organic EL device 10G, and the blue light beam LB to be emitted upward from the organic EL device 10B. The light beams LR, LG, and LB pass through, for example, the protective film 15, the sealing layer 16, the optical filter 17, and the counter substrate 18 in this order, and are emitted upward beyond the counter substrate 18. The additive color mixture of the light beams LR, LG, and LB corresponding to three primary colors allows reproduction of various colors for each pixel, achieving color image display.

However, the light beams LR, LG, and LB emitted from the self-emitting devices such as the organic EL devices 10R, 10G, and 10B each have a broad spectral shape. This makes it difficult to secure a sufficient color reproduction range when the light beams LR, LG, and LB per se are mixed.

In contrast, in the present example embodiment, the optical filter 17 is provided on the light emission side of the organic EL devices 10R, 10G, and 10B, and the optical filter 17 has the unnecessary-light-removing filter layer 171 having a predetermined spectral transmissivity. Thus, as illustrated in FIG. 6, the unnecessary-light-removing filter layer 171 transmits the band b1 including a central wavelength of each wavelength band b0 of the light beams LR, LG, and LB emitted from the organic EL devices 10R, 10G, and 10B, and removes the band b2 that is at least a part of a band other than the band b1. At this time, configuration of the unnecessary-light-removing filter layer 171 by one or a plurality of the dielectric multilayer film units U may allow the rising of the transmissivity from the band b2 to the band b1 to be sharp in the spectral transmissivity of the unnecessary-light-removing filter layer 171 (W1). Such an unnecessary-light-removing filter layer 171 may selectively remove, for example, a band b2 corresponding to a lower slope part (unnecessary light) of each wavelength band b0 of the light beams LR, LG, and LB, so as to transmit light including three bands b1 including the respective central wavelengths of the light beams LR, LG, and LB at high transmissivity.

As a result, the color purity in the light beams LR, LG, and LB may be enhanced to enable expansion of the color reproduction range (color gamut).

Further, the optical filter 17 including the unnecessary-light-removing filter layer 171 may be provided as a layer common to light-emitting sections (organic EL devices 10R, 10G, and 10B) of each pixel of the display unit 1. This enables formation of the optical filter 17 as a solid film on the substrate 170 in its manufacturing process. In addition, almost no fine alignment with each light-emitting section is also necessary. When using a color filter in which color materials R, G, and B are patterned for each pixel in order to enhance the color purity of each color light, fine alignment between the light-emitting section and the filter part is necessary to prevent concerns such as light leakage to an adjacent pixel. It is thus difficult to address issues such as larger-sized substrates or finer pixels. In contrast, the optical filter 17 according to the present example embodiment needs almost no patterning or alignment, thus making it also possible to address larger-sized substrates or finer pixels.

On the other hand, in emission light of the unnecessary-light-removing filter layer 171 as described above, increase in a viewing angle (viewing angle θ illustrated in FIG. 4) causes fluctuation of at least one component of the tristimulus values X, Y, and Z. Accordingly, color balance is deteriorated in association with the increase in the viewing angle, causing change in chromaticity. This is because the central wavelength of interference light tends to shift in a direction toward a shorter wavelength and a lower transmissivity, in association with the change in the viewing angle (FIG. 5).

In consideration of the above, the optical filter 17 further includes the viewing-angle-correcting filter layer 172 having a predetermined spectral transmissivity. More specifically, as illustrated in FIG. 6, the viewing-angle-correcting filter layer 172 may reduce the transmissivity of the band b3 that is a part of the band b1 (band including a central wavelength of at least one color light beam out of color light beams having colors of R, G, and B) which is transmitted through the unnecessary-light-removing filter layer 171. This may negate a component fluctuated in association with the foregoing change in a viewing angle, enabling the color balance to be maintained. Thus, it is possible to suppress the change in chromaticity in association with the change in a viewing angle.

Figure 9:
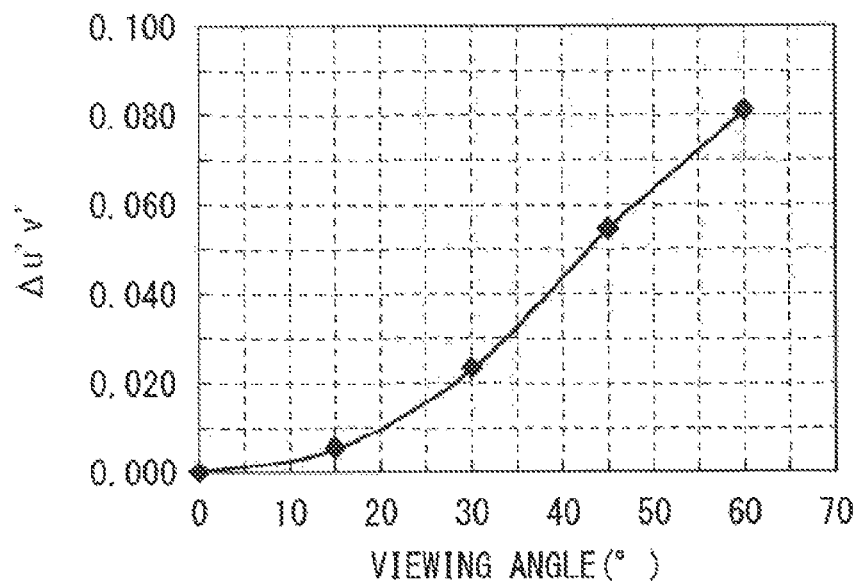
FIG. 9 is a characteristic diagram illustrating change in chromaticity relative to a viewing angle in a comparative example (when the unnecessary-light-removing filter layer is disposed alone).

As one example, FIG. 9 illustrates change in white (W) chromaticity (Δu'v') relative to the viewing angle in the emission light of the unnecessary-light-removing filter layer 171. As illustrated in FIG. 9, when using the unnecessary-light-removing filter layer 171 alone, increase in the viewing angle causes the chromaticity to be changed. The change in the chromaticity at a viewing angle of 45° is 0.055, which value, however, is not sufficient as the image quality of a display. This is because of the fluctuation (in the present example embodiment, increase) of an X component of the tristimulus values X, Y, and Z of G, for example, due to the shift of the spectral transmissivity illustrated in FIG. 7 toward a shorter wavelength in association with the change in the viewing angle, for example.

Figure 10:
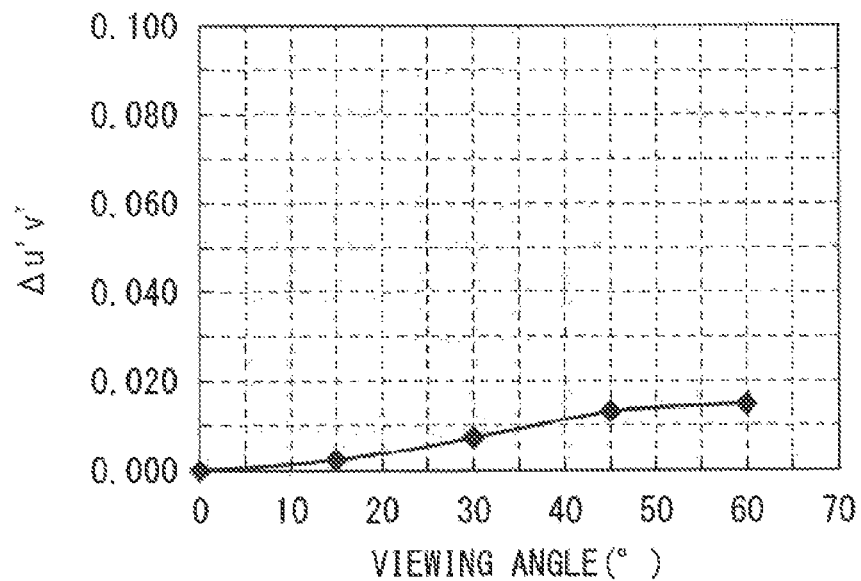
FIG. 10 is a characteristic diagram illustrating change in chromaticity relative to a viewing angle when using the optical filter illustrated in FIG. 1.

Under such circumstances, as illustrated in FIG. 8, provision of the band b3 near 660 nm using the viewing-angle-correcting filter layer 172 enables reduction of the X component of R, thus negating the increase in the X component of G. FIG. 10 illustrates the change in white (W) chromaticity (Δu'v') relative to the viewing angle in the emission light of the optical filter 17, when using, as the optical filter 17, the unnecessary-light-removing filter layer 171 and the viewing-angle-correcting filter layer 172 having a spectral transmissivity in which the band b3 is set. As illustrated in FIG. 10, even when the viewing angle increases, the change in chromaticity is suppressed to 0.020 or lower.

While the foregoing example has set forth the case where the X component increases in association with the change in the viewing angle, it also involves the case where the X component decreases. The component that increases or decreases is not limited to the X component, but may be the Y component or the Z component depending on the design of the optical filter 17. Therefore, it is preferable to set the position and the transmissivity of the band b3 in the spectral transmissivity of the viewing-angle-correcting filter layer 172, depending on a fluctuating component of the tristimulus values.

Figure 11:
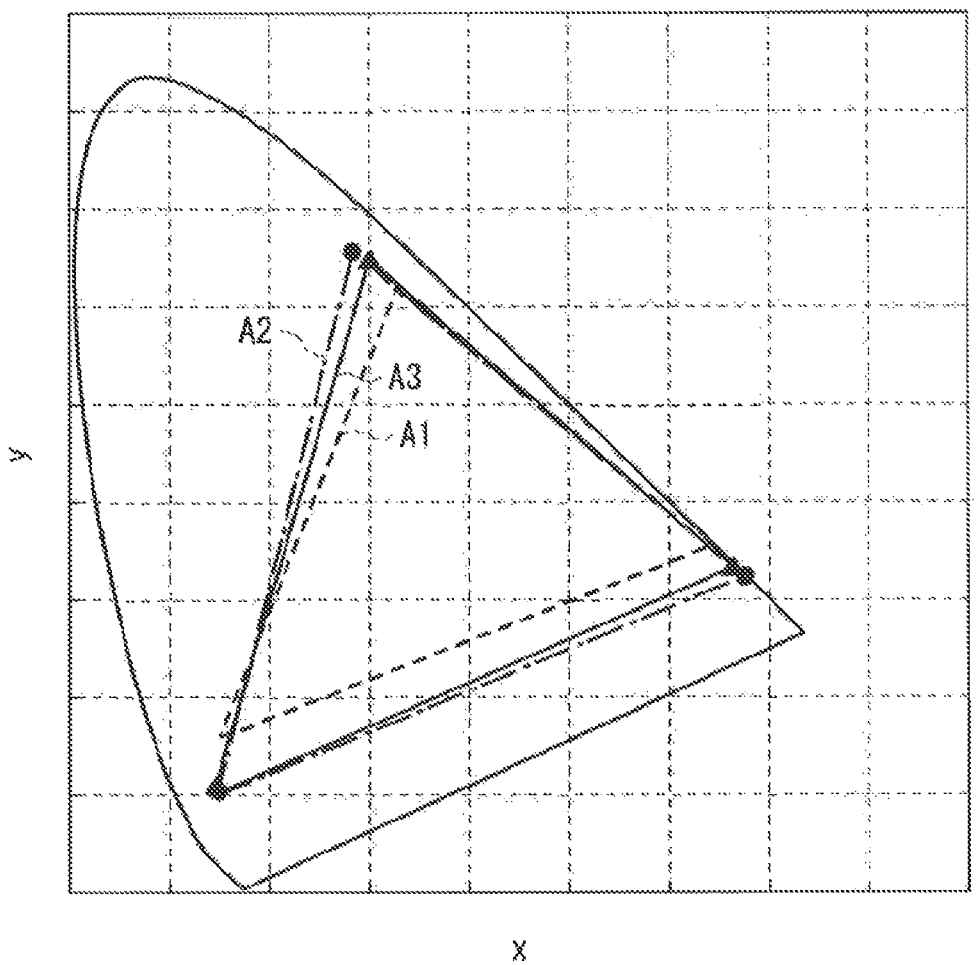
FIG. 11 is an explanatory chromaticity diagram of change in a color reproduction range.

FIG. 11 illustrates CIE (Commission Internationale de l'Eclairage) colorimetric system chromaticity diagram. A triangle indicated by A1 (broken line) in the diagram illustrates a color reproduction range based on the light beams LR, LG, and LB emitted from the organic EL devices 10R, 10G, and 10B. A triangle indicated by A2 (alternate long and short dash line) illustrates a color reproduction range in the case of using the unnecessary-light-removing filter layer 171 alone (a color reproduction range after removal of the band b2). A triangle indicated by A3 (solid line) illustrates a color reproduction range after removal of the bands b2 and b3 by the optical filter 17 in which the viewing-angle-correcting filter layer 172 is combined with the necessary-light-removing filter layer 171. As illustrated in FIG. 11, the color reproduction range A2 in the case of using the unnecessary-light-removing filter layer 171 is expanded more than the color reproduction range A1 based on the light beams LR, LG, and LB. Further, the color reproduction range A3 in the case of combining the viewing-angle-correcting filter layer 172 with the unnecessary-light-removing filter layer 171 also maintains a range substantially equal to the color reproduction range A2. Alternatively, the color reproduction range A2 shrinks to the color reproduction range A3 by an extremely slight shift amount which does not easily affect the image quality.

As described above, in the present example embodiment, the optical filter 17 including the unnecessary-light-removing filter layer 171 and the viewing-angle-correcting filter layer 172 is disposed on the light emission side of the organic EL devices 10R, 10G, and 10B. The unnecessary-light-removing filter layer 171 enables transmission of the band b1 including each central wavelength of the wavelength bands b0 corresponding to the respective color light beams LR, LG, and LB, and enables removal of the band b2 that is at least a part of a band other than the band b1. This may enhance the color purity of the respective color light beams LR, LG, and LB, enabling expansion of the color reproduction range. Further, the viewing-angle-correcting filter layer 172 of the optical filter 17 enables reduction in the transmissivity of the band b3 that is a part of the band b1 corresponding to one color light beam or two or more color light beams. This enables suppression of the change in chromaticity caused by the change in the viewing angle while suppressing shrinkage in the color reproduction range.

Therefore, it becomes possible to enhance viewing angle characteristics while securing the color reproduction range.

Figure 12:
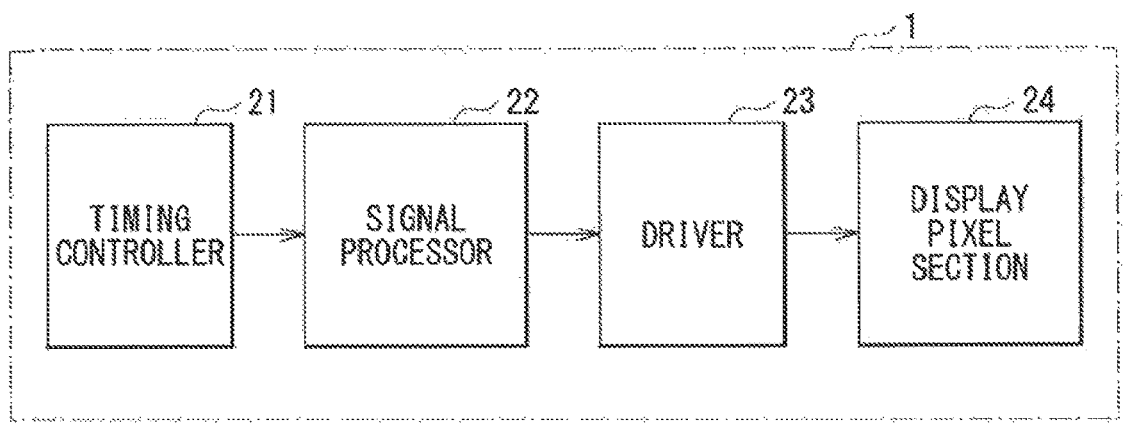
FIG. 12 is a block diagram illustrating a functional configuration example of a display unit.

FIG. 12 illustrates a functional block configuration of the display unit 1 described in the foregoing example embodiments.

The display unit 1 may display, as an image, an image signal supplied from the outside or an image signal generated inside, and may include a timing controller 21, a signal processor 22, a driver 23, and a display pixel section 24, for example.

The timing controller 21 may include a timing generator that generates various timing signals (control signals), and may perform drive control on components such as the signal processor 22, on the basis of the various timing signals. The signal processor 22 may perform predetermined correction on the digital image signal supplied from the outside, and supply the corrected image signal to the driver 23, for example. The driver 23 may include circuits such as a scanning line driver circuit and a signal line driver circuit, for example, and may drive the pixels in the display pixel section 24 via various control lines. The display pixel section 24 may include, for example, display devices such as the organic EL devices (the foregoing organic EL devices 10R, 10G, and 10B), and a pixel circuit for driving the display devices on a pixel-by-pixel basis. FIG. 1 illustrates a cross-sectional configuration of a region corresponding to three pixels of the display pixel section 24.

The display unit and the electronic apparatus according to an embodiment of the disclosure have an optical filter including a first filter layer and a second layer being disposed on light emission side of a plurality of light-emitting sections. The first filter layer transmits the first band including each center wavelength of the wavelength bands of the respective color light beams, while removing the second band that is at least a part of a band other than the first band. This enhances color purity of a color light beam emitted from each of the light-emitting sections. Further, the second filter layer of the optical filter reduces the transmissivity of the third band that is a part of the first band of at least one color light beam out of the color light beams. This enables suppression of the change in chromaticity caused by the change in the viewing angle.

The display unit and the electronic apparatus according to an embodiment of the disclosure have an optical filter including a first filter layer and a second layer being disposed on light emission side of a plurality of light-emitting sections. The first filter layer of the optical filter transmits the first band including each center wavelength of the wavelength bands of the respective color light beams, and removes the second band that is at least a part of a band other than the first band. This enhances color purity of a color light beam emitted from each of the light-emitting sections, enabling expansion of the color reproduction range. Further, the second filter layer of the optical filter reduces the transmissivity of the third band that is a part of the first band of at least one color light beam out of the color light beams. This enables suppression of the change in chromaticity caused by the change in the viewing angle, while suppressing shrinkage of the color reproduction range. Therefore, it becomes possible to enhance viewing angle characteristics while securing the color reproduction range.

Application Example

Figure 13:
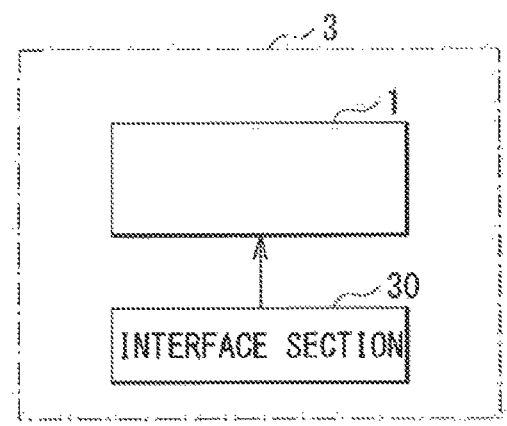
FIG. 13 is a block diagram illustrating a configuration of an electronic apparatus.

The display unit 1 according to the foregoing example embodiment may be used for various types of electronic apparatuses. FIG. 13 illustrates a functional block configuration of an electronic apparatus 3. Examples of the electronic apparatus 3 may include a television, a personal computer (PC), a smartphone, a tablet personal computer (PC), a mobile phone, a digital still camera, and a digital video camera.

The electronic apparatus 3 may include the foregoing display unit 1 (or an imaging unit 2), and an interface section 30, for example. The interface section 30 may be an input section to which elements such as various signals and power are supplied from the outside. The interface section 30 may include a user interface such as a touch panel, a keyboard, or an operational button, for example.

Figure 14:
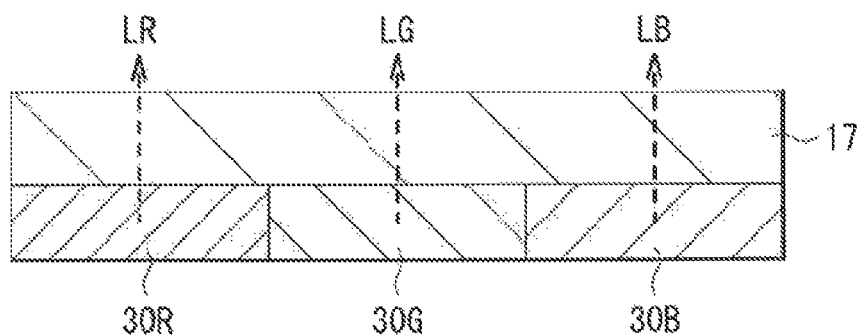
FIG. 14 is a schematic cross-sectional view of another configuration example of a display unit.

Although the disclosure has been described hereinabove by way of example with reference to the example embodiments, the disclosure is not limited thereto but may be modified in a wide variety of ways. For example, while the foregoing example embodiments set forth, as an example, the configuration in which the optical filter is disposed on the light emission side of the organic EL device, the optical filter may also be applied to a light source other than the organic EL device. As illustrated in FIG. 14, it is sufficient that the optical filter may be disposed on the light emission side of a device having light-emitting sections (light sources) 30R, 30G, and 30B that emit each color light beams of R, G, and B, respectively; the application of the optical filter is not limited to the organic EL display unit as described above. Examples of the light-emitting sections 30R, 30G, and 30B may include a light-emitting diode (LED), in addition to the organic EL device.

Figure 15:
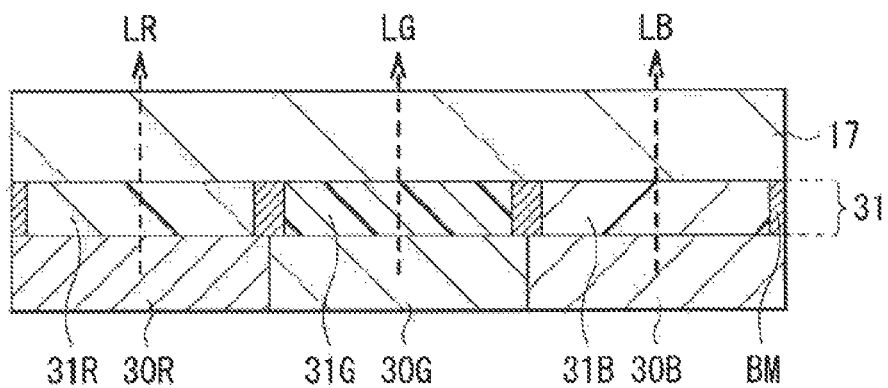
FIG. 15 is schematic cross-sectional view of yet another configuration example of a display unit.

While the foregoing example embodiments set forth the configuration in which no color filter is disposed, the optical filter according to an embodiment of the disclosure is also applied to a device provided with a color filter. As illustrated in FIG. 15, the optical filter 17 may be provided on the light emission side of the light-emitting sections (light sources) 30R, 30G, and 30B, with a color filer layer 31 interposed therebetween, for example. In circumstances such as those when a sufficient color gamut is not secured in the color filter layer 31, further layering of the optical filter 17 makes it possible to further enhance color purity more than the case of providing only the color filter layer 31.

While the foregoing example embodiments set forth, as an example, the configuration in which a pixel of three primary colors R, G, and B is used as one pixel unit, the display unit according to an embodiment of the disclosure is not necessarily limited to the configuration involving only the pixel of three primary colors. It is also possible to further include a pixel that emits color light beams having colors different from R, G, and B, for example. That is, it is also possible to include a pixel of four colors such as R, G, B, and W (white), or four colors such as R, G, B, and Y (yellow).

In addition, the display unit does not need to include all the foregoing layers. Alternatively, the display unit may also include yet other layers in addition to the foregoing layers. Moreover, the effects described above in the example embodiments, etc. are mere examples, and the effects of the disclosure may be other effects, or may further include other effects in addition to the effects described above.

It is possible to achieve at least the following configurations from the foregoing example embodiments and the modification examples of the disclosure.

(1) A display unit, including:
a plurality of light-emitting sections that emit respective color light beams, the color light beams having colors different from one another; and
an optical filter that is disposed on light emission side of the plurality of light-emitting sections and transmits the color light beams while selectively removing a part of a wavelength band of the color light beams, the optical filter including
    a first filter layer that transmits a first band including a center wavelength out of the wavelength band of each of the color light beams, and removes a second band that is at least a part of a band other than the first band, and
    a second filter layer that reduces transmissivity of a third band that is a part of the first band of at least one color light beam out of the color light beams.

(2) The display unit according to (1), further including a circularly polarizing plate provided on the light emission side of the plurality of light-emitting sections.

(3) The display unit according to (1) or (2), wherein the first filter layer and the second filter layer each include a dielectric multilayer film.

(4) The display unit according to (3), wherein the dielectric multilayer film includes a plurality of refractive index layers that are layered adjacently and have refractive indices different from one another.

(5) The display unit according to (4), wherein the plurality of refractive index layers have a volume average refractive index of 2.0 or higher.

(6) The display unit according to any one of (1) to (5), wherein the first band and the second band are set to cause the first filter layer to narrow each of the wavelength bands of the color light beams emitted from the plurality of light-emitting sections and to transmit each of the narrowed wavelength bands of the color light beams.

(7) The display unit according to any one of (1) to (6), wherein the third band is set to cause the second filter layer to offset fluctuation of at least one component of tristimulus values X, Y, and Z, the fluctuation occurring in association with increase in a viewing angle.

(8) The display unit according to any one of (1) to (7), wherein the optical filter is disposed on the light emission side of the plurality of light-emitting sections, as a layer common to each of the plurality of light-emitting sections.

(9) An electronic apparatus with a display unit, the display unit including:
a plurality of light-emitting sections that emit respective color light beams, the color light beams having colors different from one another; and
an optical filter that is disposed on light emission side of the plurality of light-emitting sections and transmits the color light beams while selectively removing a part of a wavelength band of the color light beams, the optical filter including
    a first filter layer that transmits a first band including a center wavelength out of the wavelength band of each of the color light beams, and removes a second band that is at least a part of a band other than the first band, and
    a second filter layer that reduces transmissivity of a third band that is a part of the first band of at least one color light beam out of the color light beams.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" or "approximately" as used herein can allow for a degree of variability in a value or range. The term "light" as used herein may refer to monochromatic light, mixed color light, a single light beam, a plurality of light beams, or general light. Moreover, no element or component in this disclosure is intended to be dedicated to the public regardless of whether the element or component is explicitly recited in the following claims.

What is claimed is:

1. A display unit, comprising:
    a plurality of light-emitting sections that emit respective color light beams, the color light beams having colors different from one another; and
    an optical filter that is disposed on light emission side of the plurality of light-emitting sections and transmits the color light beams while selectively removing a part of a wavelength band of the color light beams, the optical filter including
        a first filter layer that transmits a first band including a center wavelength out of the wavelength band of each of the color light beams, and removes a second band that is at least a part of a band other than the first band, and
        a second filter layer that reduces transmissivity of a third band that is a part of the first band of at least one color light beam out of the color light beams.

2. The display unit according to claim 1, further comprising a circularly polarizing plate provided on the light emission side of the plurality of light-emitting sections.

3. The display unit according to claim 1, wherein the first filter layer and the second filter layer each include a dielectric multilayer film.

4. The display unit according to claim 3, wherein the dielectric multilayer film includes a plurality of refractive index layers that are layered adjacently and have refractive indices different from one another.

5. The display unit according to claim 4, wherein the plurality of refractive index layers have a volume average refractive index of 2.0 or higher.

6. The display unit according to claim 1, wherein the first band and the second band are set to cause the first filter layer to narrow each of the wavelength bands of the color light beams emitted from the plurality of light-emitting sections and to transmit each of the narrowed wavelength bands of the color light beams.

7. The display unit according to claim 1, wherein the third band is set to cause the second filter layer to offset fluctuation of at least one component of tristimulus values X, Y, and Z, the fluctuation occurring in association with increase in a viewing angle.

8. The display unit according to claim 1, wherein the optical filter is disposed on the light emission side of the plurality of light-emitting sections, as a layer common to each of the plurality of light-emitting sections.

9. An electronic apparatus with a display unit, the display unit comprising:
    a plurality of light-emitting sections that emit respective color light beams, the color light beams having colors different from one another; and
    an optical filter that is disposed on light emission side of the plurality of light-emitting sections and transmits the color light beams while selectively removing a part of a wavelength band of the color light beams, the optical filter including
        a first filter layer that transmits a first band including a center wavelength out of the wavelength band of each of the color light beams, and removes a second band that is at least a part of a band other than the first band, and
        a second filter layer that reduces transmissivity of a third band that is a part of the first band of at least one color light beam out of the color light beams.

10. The electronic apparatus according to claim 9, further comprising a circularly polarizing plate provided on the light emission side of the plurality of light-emitting sections.

11. The electronic apparatus according to claim 9, wherein the first filter layer and the second filter layer each include a dielectric multilayer film.

12. The electronic apparatus according to claim 11, wherein the dielectric multilayer film includes a plurality of refractive index layers that are layered adjacently and have refractive indices different from one another.

13. The electronic apparatus according to claim 12, wherein the plurality of refractive index layers have a volume average refractive index of 2.0 or higher.

14. The electronic apparatus according to claim 9, wherein the first band and the second band are set to cause the first filter layer to narrow each of the wavelength bands of the color light beams emitted from the plurality of light-emitting sections and to transmit each of the narrowed wavelength bands of the color light beams.

15. The electronic apparatus according to claim 9, wherein the third band is set to cause the second filter layer to offset fluctuation of at least one component of tristimulus values X, Y, and Z, the fluctuation occurring in association with increase in a viewing angle.

16. The electronic apparatus according to claim 9, wherein the optical filter is disposed on the light emission side of the plurality of light-emitting sections, as a layer common to each of the plurality of light-emitting sections.

* * * * *